(12) United States Patent
Chih

(10) Patent No.: US 7,319,609 B2
(45) Date of Patent: Jan. 15, 2008

(54) NON-VOLATILE MEMORY DEVICE WITH A PROGRAMMING CURRENT CONTROL SCHEME

(75) Inventor: Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 90 days.

(21) Appl. No.: 11/303,081

(22) Filed: Dec. 14, 2005

(65) Prior Publication Data

US 2007/0133293 A1    Jun. 14, 2007

(51) Int. Cl.
G11C 11/34    (2006.01)
G11C 16/04    (2006.01)

(52) U.S. Cl. .............................. 365/185.02; 365/185.28

(58) Field of Classification Search ....... 365/185.02 O, 365/185.17, 185.28 X, 185.33, 185.02, 185.28
See application file for complete search history.

(56) References Cited

U.S. PATENT DOCUMENTS 5,706,240 A * 1/1998 Fiocchi et al. .............. 365/226
5,905,677 A * 5/1999 Casagrande et al. ... 365/185.23

* cited by examiner

Primary Examiner—VanThu Nguyen
(74) Attorney, Agent, or Firm—K & L Gates LLP

(57) ABSTRACT

A non-volatile memory device includes at least one current source coupled to a bit line, along which at least two memory cells sharing a common source line are connected, for generating a programming current on the bit line when one of the memory cells is selected for programming operation. At least one voltage regulator is coupled to the bit line between the current source and the memory cells for allowing the programming current to flow between the current source and the selected memory cell when a voltage level on the bit line is higher than a predetermined reference voltage, and blocking the programming current flowing between the current source and the selected memory cell when the voltage level on the bit line is lower than the predetermined reference voltage, thereby preventing a punch-through across the unselected memory cell from occurring.

13 Claims, 4 Drawing Sheets

NON-VOLATILE MEMORY DEVICE WITH A PROGRAMMING CURRENT CONTROL SCHEME

BACKGROUND

The present invention relates generally to integrated circuit (IC) designs, and more particularly to a non-volatile memory device with a programming current control scheme.

Non-volatile memory is a term to describe the kind of memory devices that do not need constant supply of power to permanently store data. Flash memory is one of the most popular non-volatile memories available in the market, partly because of its capability to allow easy and fast permanent data storage for electronic devices such as computers, digital cameras, and many other portable devices. Flash memory can also provide reliable data storage capability, since it has no moving parts, which often cause failures in hard disc drives.

Various types of flash memory cells have been developed in the last few decades. For example, the memory cell can be a floating gate memory cell, a split gate memory cell, or a multi-bit memory cell. These memory cells typically include a control gate and a separate data storage gate, which can be made of either conductive or dielectric materials. During the programming operation, the control gate is applied a predetermined voltage, the source or drain region of the memory cell is biased at a voltage much higher than the predetermined voltage, and a programming current is applied to flow through the memory cell depending on the data value to be written into the memory cell. Due to the hot carrier effect, electrons are injected from the source or drain region into the data storage gate. After the programming is done, the electrons will be trapped in the data storage gate, thereby storing a value in the memory cell.

Conventionally, the total amount of programming current of a flash memory device depends on the data value that is going to be written in it. For example, the total programming current typically equals to 8 times of the programming current for one memory cell, if the data value is 0x00, which has 8 bits of "0." Yet, the total programming current typically equals to 4 times of the programming current for one memory cell, if the data value is 0x0F, which has 4 bits of "0" and 4 bits of "1." As a result, the programming of the flash memory device can be easily disturbed as the data value to be written in the memory device varies.

During the programming operation, some of the memory cells are selected and some are not. At the end of the operation, the voltage at the control gate of the selected memory cell drops significantly, while a current source still maintains the programming current constant on the bit line. This causes the voltage level on the bit line to drop even lower. An unselected memory cell adjacent to the selected memory cell is typically coupled between the bit line and a source line, which it shares with the selected memory cell. While the voltage on the bit line drops to a very low level at the end of the operation, the voltage on the common source line remains very high. Thus, the unselected memory cell is particularly susceptible to a punch-through due to a large voltage difference between the bit line and the source line.

As such, it is desirable to have a non-volatile memory device with a programming current control scheme that addresses the disturbance and punch-through issues.

SUMMARY

The present invention discloses a non-volatile memory device. In one embodiment the non-volatile memory device includes at least one current source coupled to a bit line, along which at least two memory cells sharing a common source line are connected, for generating a programming current on the bit line when one of the memory cells is selected for programming operation; and at least one voltage regulator coupled to the bit line between the current source and the memory cells for allowing the programming current to flow between the current source and the selected memory cell when a voltage level on the bit line is higher than a predetermined reference voltage, and blocking the programming current flowing between the current source and the selected memory cell when the voltage level on the bit line is lower than the predetermined reference voltage, thereby preventing a punch-through across the unselected memory cell from occurring.

The construction and method of operation of the invention, however, together with additional objectives and advantages thereof will be best understood from the following description of specific embodiments when read in connection with the accompanying drawings.

DESCRIPTION

Figure 1:
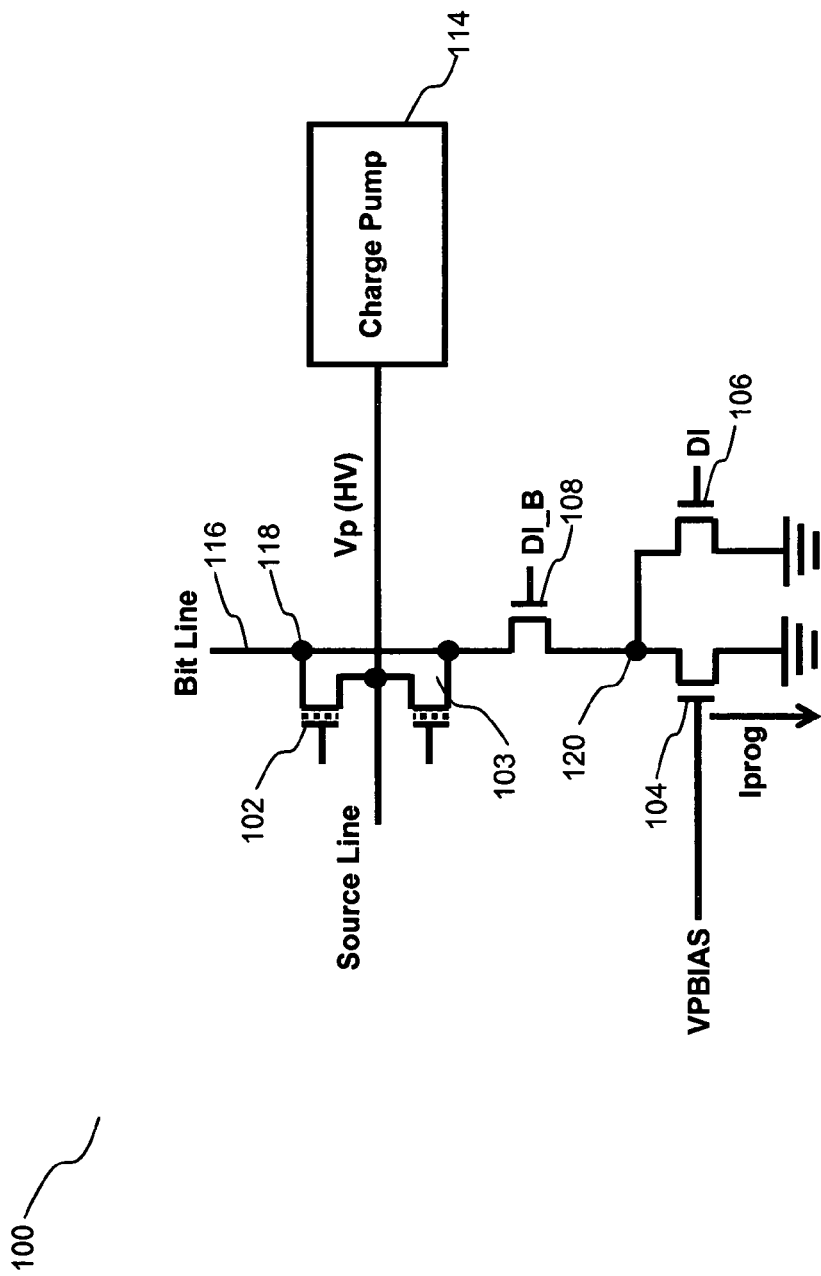
FIG. 1 schematically illustrates a conventional circuit for programming a memory cell of a non-volatile memory device.

FIG. 1 illustrates a conventional circuit 100 for programming a memory cell 102 of a non-volatile memory device. The memory cell 102 and its neighboring memory cell 103, which share a common source line, are coupled to a bit line. The common source line is coupled to an output terminal of a charge pump 114. NMOS devices 108 and 104 are serially coupled between the memory cell 103 and a complementary power supply, such as ground. An NMOS device 106 is coupled between the NMOS device 108 and the complementary power supply is parallel with the NMOS device 104. The NMOS device 108 is controlled by a signal DI_B and the NMOS device 106 is controlled by a signal DI. The NMOS device 104 is controlled by a programming bias signal for functioning as a current source to generate a programming current on the bit line during the programming operation.

During the programming operation, the memory cell 102 is selected by raising the voltage level at its control gate to a predetermined level. The charge pump 114 increases the voltage on the source line to a level much higher than that at the control gate of the selected memory cell 102. If a logic "1" is to be written into the selected memory cell 102, the DI_B signal will be at a low level to turn off the NMOS transistor 108, and the DI signal will be at a high level to turn on the NMOS transistor 106. As a result, no programming current will be present at the node 118, and electrons will be injected into the data storage gate of the selected memory cell 102. If a logic "0" is to be written into the selected memory cell 102, the DI_B signal will be at a high level to turn on the NMOS transistor 108, and the DI signal will be at a low level to turn off the NMOS transistor 106. As a result, the NMOS transistor 104 will provide the bit line with a programming current.

One drawback of the conventional circuit design is that the output of the charge pump 114 is easily disturbed. As discussed above, no programming current is present on the bit line when the value to be written into the selected memory cell 102 is "1," while a programming current is generated on the bit line when the value to be written into the selected memory cell 102 is "0." Thus, the total programming current of the non-volatile memory device depends on the data value that is going to be written into it. For example, the total programming current typically equals to 8times of the programming current for one memory cell, if the data value is 0×00, which has 8 bits of "0." Yet, the total programming current typically equals to 4 times of the programming current for one memory cell, if the data value is 0×0F, which has 4 bits of "0" and 4 bits of "1." It is understood by those skilled in the art that the output of the charge pump 114 is affected by the total amount of the programming current. As such, its output can be easily disturbed.

Another drawback of the conventional circuit design is that the unselected memory cell 103 is particularly susceptible to the punch-through effect. At the end of the programming operation, the voltage level at the control gate of the selected memory cell 102 drops significantly, while the NMOS device 104 still maintains a constant programming current on the bit line. As a result, the voltage level on the bit line is pulled even lower, thereby creating a huge voltage difference across the NMOS device 103. This can cause the punch-through across the unselected NMOS device 103 to occur.

Figure 2:
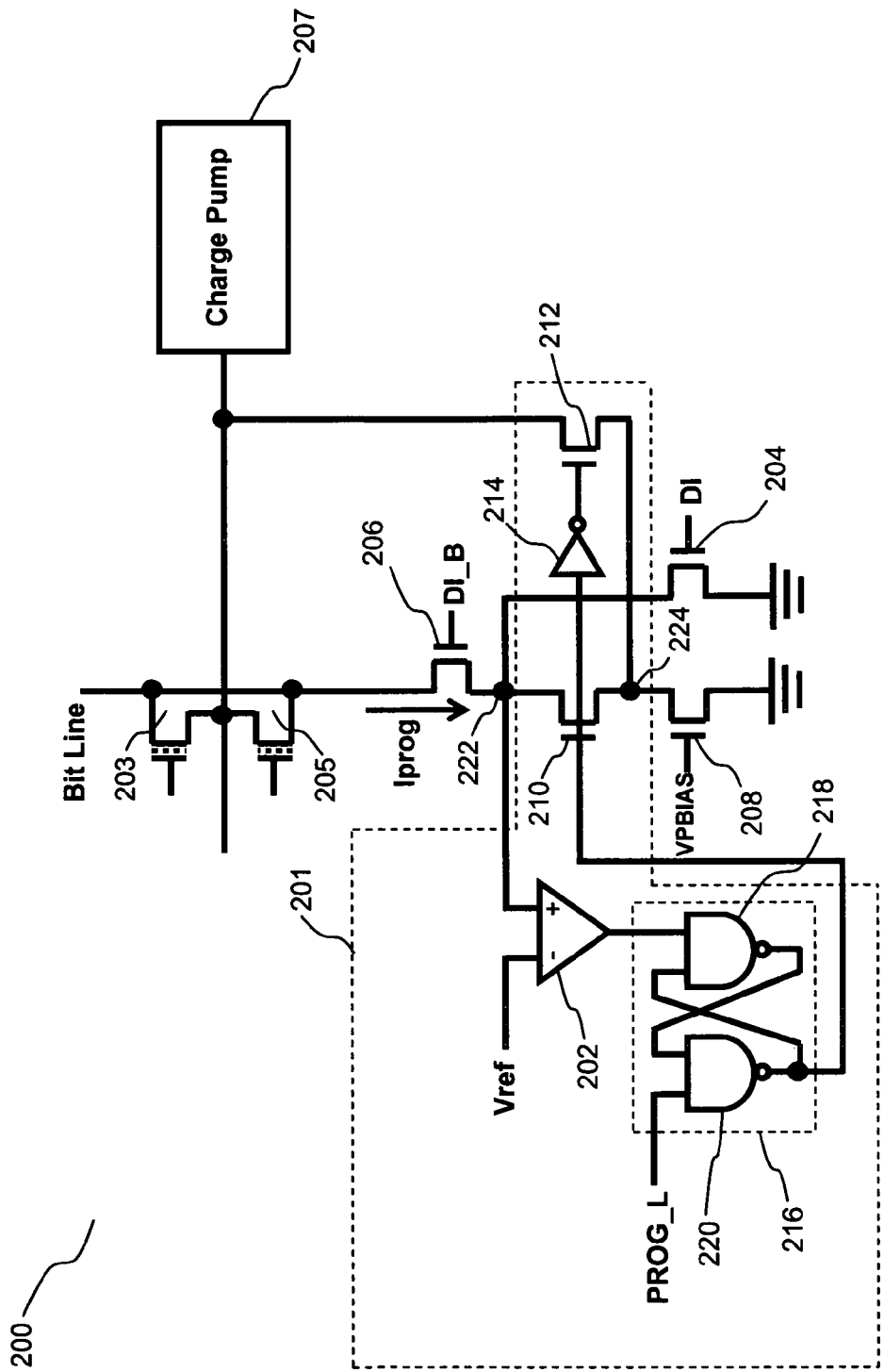
FIG. 2 schematically illustrates a circuit for programming a memory cell of a non-volatile memory device in accordance with one embodiment of the present invention.

FIG. 2 schematically illustrates a circuit 200 for programming a memory cell of a non-volatile memory device in accordance with one embodiment of the present invention. The circuit 200 includes a comparator 202, NMOS devices 204, 206, 208, 210, and 212, an inverter 214, and a latch module 216, which further includes two cross-coupled NAND gate logic devices 218 and 220. The combination of the NMOS devices 204, 206, and 208 can be viewed as a circuit module coupled with the bit line and a voltage regulator 201. The drain of the NMOS device 204 is coupled to a node 222 while its source is tied to a complementary power supply, such as ground. The gate of the NMOS device 204 is controlled by a data input signal (DI). The NMOS device 206, with its source also coupled to the node 222 and its drain tied to the memory cell 205, is controlled by an inverted data input signal (DI_B). The NMOS device 208 functions as a current source for providing the bit line with a programming current Iprog. The gate of the NMOS device 208 is supplied with a bias programming voltage (VPBIAS), which controls how much programming current is supplied to the bit line. The NMOS device 210 is placed between the node 222 and a node 224, with its gate connected to both the output of the latch module 216 and the input of the inverter 214. The voltage regulator 201 includes the NMOS devices 210 and 212, the comparator 202, the inverter 214, and the latch module 216. The output of the inverter 214 is tied directly to the gate of the NMOS device 212, whose drain is coupled to the node 224 and its source is coupled to an output terminal of the charge pump 207.

If the data being programmed or the data input signal (DI) is "0," the NMOS device 204 will be turned off while the NMOS device 206 will be turned on. The comparator 202 compares the voltage signal at the node 222 with the reference voltage Vref to output a control signal that causes the latch module 216 to output a latched control signal at a high level to turn on the NMOS device 210. The inverter 214 inverts the output from the latch module 216 to turn off the NMOS device 212, thereby preventing the programming current Iprog from passing thereacross to the output terminal of the charge pump 207.

If the data being programmed or the data input signal (DI) is "1," the NMOS device 204 will be turned on while the NMOS device 206 will be turned off. The comparator 202 compares the voltage signal at the node 222 with the reference voltage Vref to output a control signal that causes the latch module 216 to output a latched control signal at a low level to turn off the NMOS device 210. The inverter 214 inverts the output from the latch module 216 to turn on the NMOS device 212, thereby allowing the programming current Iprog to pass thereacross to the output terminal of the charge pump 207.

The proposed embodiment of the present invention helps to stabilize the output of the charge pump 207. As discussed above, when a "1" is being programmed into a memory cell, the NMOS device 212 is turned on to allow the programming current to flow between the NMOS device 208 and the output terminal of charge pump 207. Thus, the total programming current of a memory device does not depend on the data value to be written therein. For example, the total programming current typically equals to 8 times of the programming current for one memory cell, if the data value is 0×00, which has 8 bits of "0." In this embodiment, the total programming current still equals to 8 times the programming current for one memory cell, even if the data value is 0×0F, which has 4 bits of "0" and 4 bits of "1." The output stability of the charge pump 207 is therefore improved, since it no longer depends on the data value to be written in the memory device.

The proposed embodiment of the present invention also helps to prevent a punch-through from occurring at the unselected memory cell 205 when the selected memory cell 203 is being programmed. At the end of the programming operation, the voltage at the gate of the memory cell 203 drops significantly, while the NMOS device 208 maintains a constant programming current Iprog on the bit line. This causes the voltage on the bit line to drop even lower. When the voltage on the bit line drops below the predetermined voltage level Vref, the comparator outputs a control signal, which causes the latch module 216 to output a latched control signal to turn off the NMOS device 210. As a result, the programming current Iprog is cut off from the memory cells 203 and 205, thereby preventing the voltage at the drain of the memory cell 205 from dropping even lower. This helps to reduce the voltage difference between the source and drain of the memory cell 205. Thus, the punch-through across the memory cell 205 can be avoided.

Note that the memory cells can be any kind of non-volatile memory cell that utilizes the electron-injection effect for data programming. For example, the memory cell can be a split gate cell, floating gate cell, multi-bit cell or other electrical programmable read only memory cell. While the circuit 200 shows a number of NMOS devices used to control the on and off for various current paths, they can be replaced by other switch devices, such as PMOS devices, depending on design needs. It is understood by those skilled in the art that while the latch module 216 is shown as two cross-coupled NAND logic gate devices, they can be replaced by other equivalent circuit designs.

Figure 3:
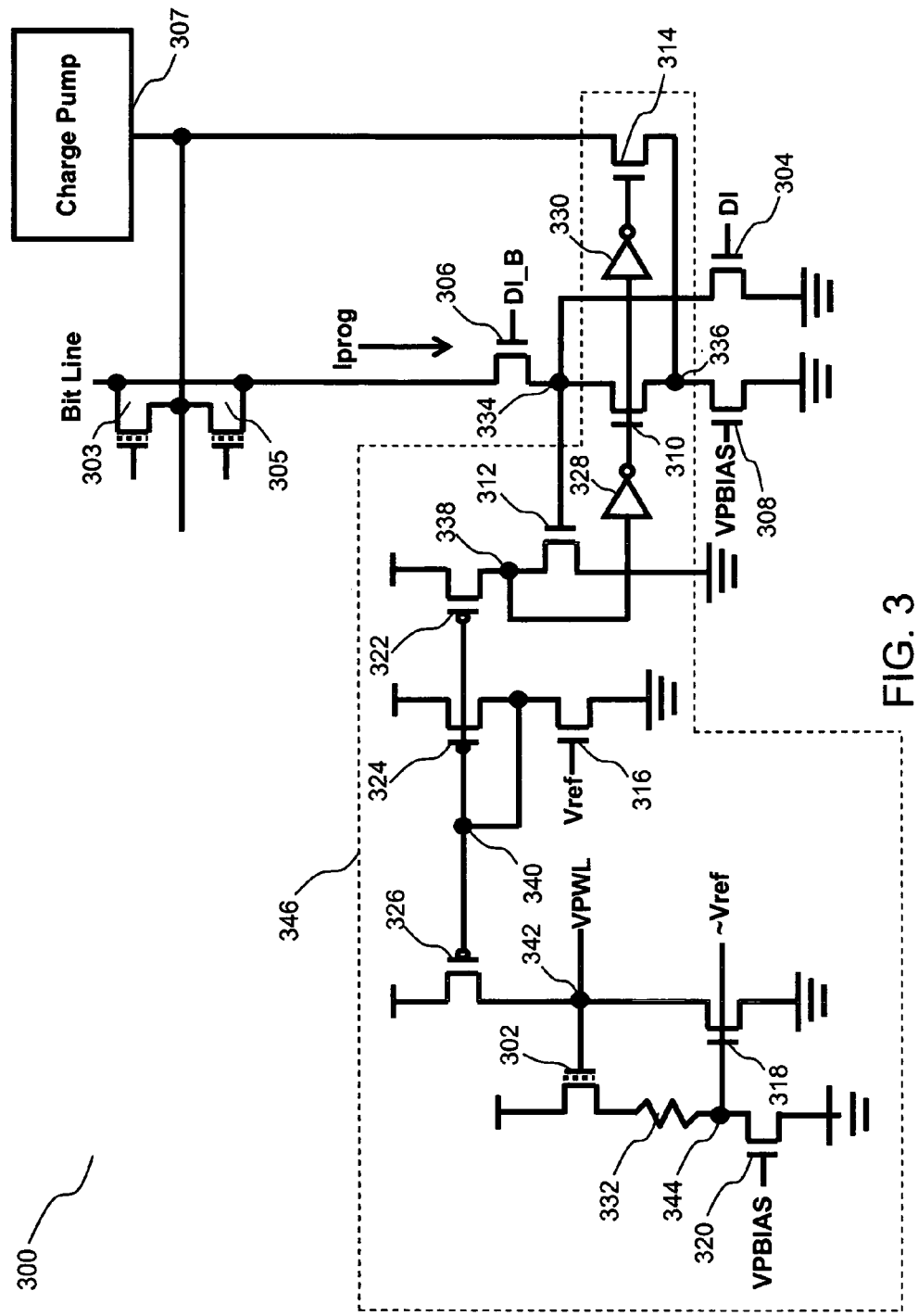
FIG. 3 schematically illustrates a circuit for programming a memory cell of a non-volatile memory device in accordance with another embodiment of the present invention.

FIG. 3 schematically illustrates a circuit 300 for programming a memory cell of a non-volatile memory device in accordance with another embodiment of the present invention. The circuit 300 includes a memory cell 302, NMOS devices 304, 306, 308, 310, 312, 314, 316, 318, and 320, PMOS devices 322, 324, and 326, inverters 328 and 330, and a resistor 332. The NMOS devices 304, 306, and 308 can be viewed as a programming device, in a configuration similar to the NMOS devices shown in FIG. 2.

The drain of the NMOS device 304 is coupled with a node 334 while its source is tied to a complementary power supply, such as ground. The gate of the NMOS device 304 is controlled by a data input signal (DI). The NMOS device 306, with its source coupled to the node 334 and its drain tied to a bit-line, is controlled by an inverted data input signal (DI_B). The NMOS device 308 functions as a current source for providing the bit line with a programming current Iprog. The gate of the NMOS device 308 is supplied with a bias programming voltage (VPBIAS), which controls how much programming current Iprog is supplied to the bit line. The NMOS device 310 is placed between the node 334 and a node 336 with its gate connected to both the output of the inverter 328 and the input of the inverter 330. The input of the inverter 328 is coupled to a node 338, which is tied to the NMOS device 312 and the PMOS device 322. The gate of the NMOS device 312 is connected to the node 334. The output of the inverter 330 is tied directly to the gate of the NMOS device 314.

The gate of the PMOS devices 322, 324, and 326 are all coupled together at a node 340, which is controlled by the NMOS device 316. The gate of the NMOS device 316 is supplied with a predetermined reference voltage Vref. By controlling the NMOS device 316 with the predetermined reference voltage Vref, the PMOS devices 322, 324, and 326 can be controlled at the same time. The drain of the PMOS device 326 is coupled to the gate of the memory cell 302 and the drain of the NMOS device 318 through a node 342. The node 342 is further supplied with the word line programming voltage VPWL. The gate of the NMOS device 318 is tied to the drain of the NMOS device 320 through a node 344. The resistor 332 is placed between the node 344 and the memory cell 302. The combination of the NMOS devices 310, 312, 314, 316, 318, and 320, the PMOS devices 322, 324, and 326, the memory cell 302, and the inverters 328 and 330 can be viewed as a voltage regulator 346 for regulating the programming current Iprog on the bit line.

During the programming operation, if the data value being programmed or the data input signal (DI) is "0," the NMOS device 304 will be turned off while the NMOS device 306 will be turned on. The predetermined reference voltage Vref turns on the NMOS device 316, thereby pulling the node 340 low. This turns on the PMOS transistors 326, 324 and 322. For the most of time in the programming operation, the voltage on the bit line is higher than the predetermined reference voltage Vref, so that the NMOS device 312 is turned on and the node 338 is pulled low. The inverter 328 receives a low signal at the node 338 and outputs a high signal to turn on the NMOS device 310. The inverter 330 inverts the signal output from the inverter 328 and outputs a low signal to turn off the NMOS device 314. Thus, the programming current Iprog is supplied to the bit line for writing a "0" in a selected memory cell 303.

If the data value being programmed or the data input signal (DI) is "1," the NMOS device 304 will be turned on while the NMOS device 306 will be turned off. The predetermined reference voltage Vref turns on the NMOS device 316, thereby pulling the node 340 low. This turns on the PMOS transistors 326, 324 and 322. Since the NMOS device 304 is turned on, the node 334 is pulled low and the NMOS device 312 is turned off. This causes the node 338 to be at a high voltage level. The inverter 328 receives a high signal at the node 338 and outputs a low signal to turn off the NMOS device 310. The inverter 330 inverts the signal output from the inverter 328 and outputs a high signal to turn on the NMOS device 314. Thus, the programming current Iprog is blocked from flowing to the selected memory cell 303 via the bit line, while it is redirected to the output terminal of the charge pump 307 through the NMOS device 314.

The proposed embodiment of the present invention helps to stabilize the output of the charge pump 307. As discussed above, when a "1" is being programmed into a memory cell, the NMOS device 314 is turned on to allow the programming current Iprog to flow from the NMOS device 308 to the output terminal of the charge pump 307. Thus, the total programming current of a memory device does not depend on the data value to be written therein. As such, the output stability of the charge pump 307 is therefore improved, since it no longer depends on the data value to be written in the memory cell.

The proposed embodiment of the present invention also helps to prevent a punch-through from occurring at the unselected memory cell 305 when the selected memory cell 303 is being programmed. At the end of the programming operation, the voltage at the gate of the selected memory cell 303 drops significantly, while the NMOS device 308 maintains a constant programming current Iprog on the bit line. This causes the voltage on the bit line to drop even lower. When the voltage on the bit line drops below the predetermined reference voltage level Vref, the NMOS device 312 is turned off, thereby causing the node 338 to increase to a high voltage level. As a result, the NMOS device 310 is turned off and the programming current Iprog is cut off from the memory cells 303 and 305, thereby preventing the voltage at the drain of the unselected memory cell 305 from dropping even lower. This helps to reduce the voltage difference between the source and drain of the unselected memory cell 305. Thus, the punch-through across the memory cell 305 can be avoided.

Note that the word line programming voltage VPWL is designed to be approximately Vref+Vt+I*R where the Vt is the threshold voltage of the memory cell 302, I is the current across the memory cell 302, and the R is the resistance of the resistor 332.

Note that the memory cells can be any kind of non-volatile memory cell that utilizes the electron-injection effect for data programming. For example, the memory cell can be a split gate cell, floating gate cell, multi-bit cell or other electrical programmable read only memory cell. While the circuit 300 shows a number of NMOS devices used to control the on and off and various current paths, they can be replaced by other switch devices, such as PMOS devices, depending on design needs.

Figure 4:
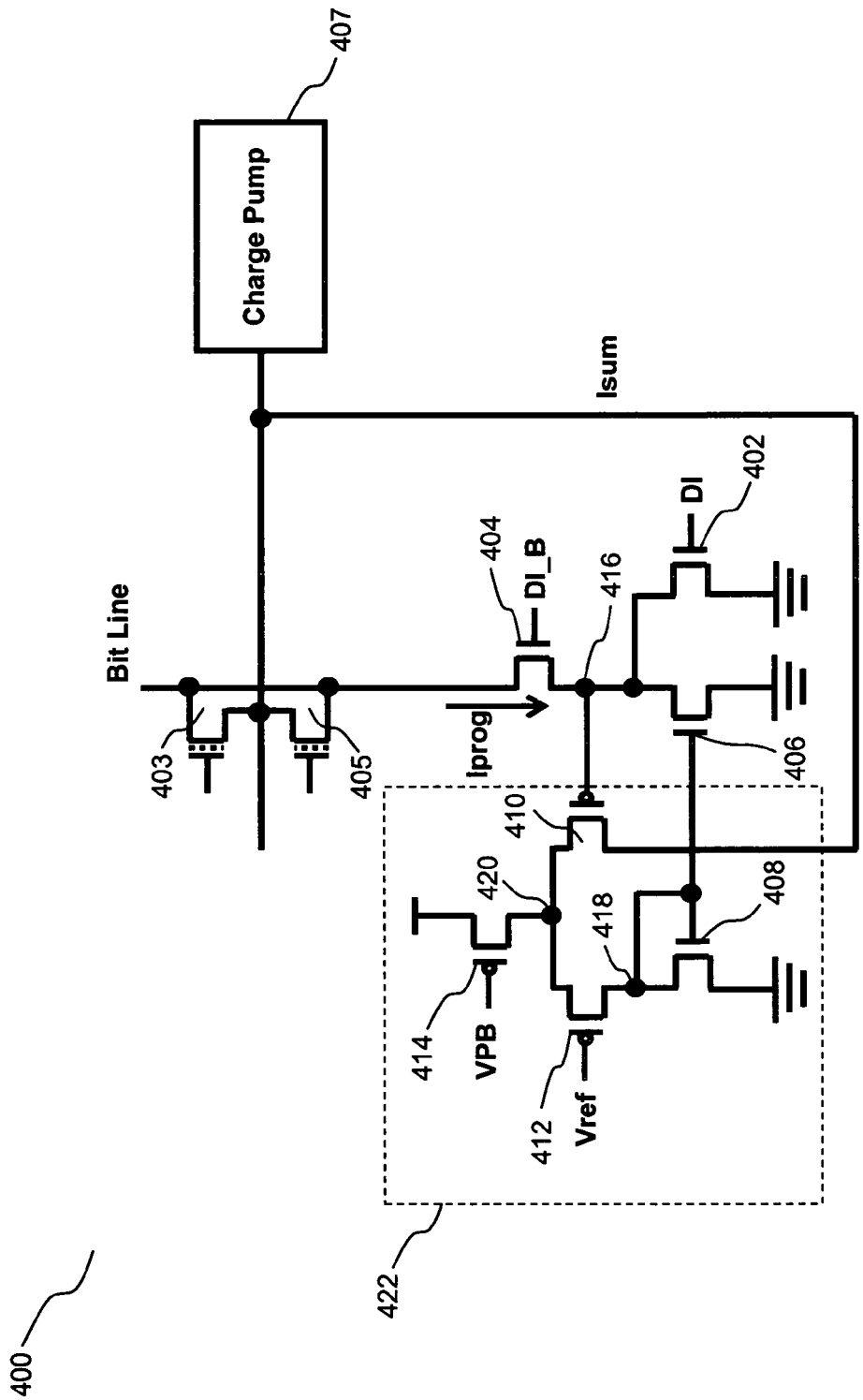
FIG. 4 schematically illustrates a circuit for programming a memory cell of a non-volatile memory device in accordance with yet another embodiment of the present invention.

FIG. 4 schematically illustrates a circuit 400 for programming a memory cell of a non-volatile memory device in accordance with yet another embodiment of the present invention. The circuit 400 includes NMOS devices 402, 404, 406, and 408 and PMOS devices 410, 412, and 414. The drain of the NMOS device 402 is coupled with a node 416 while its source is tied to a complementary power supply, such as ground. The gate of the NMOS device 402 is controlled by a data input signal (DI). The NMOS device 404, with its drain coupled with the node 416 and its source tied to a bit-line, is controlled by an inverted data input signal (DI_B). The gate of the NMOS device 406 and the gate and the drain of the NMOS device 408 are all coupled together at a node 418. The drain of the NMOS device 406 is also coupled to the node 416 where it is tied to the gate of the PMOS device 410. The node 418 is coupled with the drain of the PMOS device 412 whose gate is controlled by a predetermined reference voltage Vref. The sources of the PMOS devices 410 and 412 and the drain of the PMOS devices 414 are tied together at a node 420. The PMOS device 414, with its source tied to the supply source, is controlled by a programming bias voltage Vpb. The combination of the NMOS device 408 and the PMOS devices 410, 412, and 414 can be viewed as a voltage regulator 422 for controlling the voltage level on the bit line.

The predetermined reference voltage 412 is designed to turn on the PMOS device 412, so that the voltage at the gate of the NMOS device 406 varies depending on the programming bias voltage Vpb at the gate of the PMOS device 414. The NMOS device 406 functions as current source to provide the bit line with the programming current Iprog. The amount of Iprog depends on the level of the programming bias voltage Vpb.

During the programming operation, if the data value being programmed or the data input signal (DI) is "0," the NMOS device 402 will be turned off while the NMOS device 404 will be turned on, thereby allowing the programming current Iprog to pass across the NMOS device 404. If the data value being programmed or the data input signal (DI) is "1," the NMOS device 402 will be turned on, while the NMOS device 404 will be turned off, thereby pulling the node 416 low. This turns on the PMOS device 410, thereby passing a current Isum to the output terminal of the charge pump 407. Thus, the output of the charge pump 307 can be stabilized as it no longer depends on the data value to be written in the memory cell.

At the end of the programming operation, the voltage at the gate of the memory cell 403 drops significantly, while the NMOS device 406 maintains a constant programming current Iprog on the bit line. This causes the voltage on the bit line to drop even lower. When the voltage on the bit line drops below the predetermined reference voltage Vref, the PMOS device 410 is turned on. This reduces the voltage at the source of the PMOS device 412, thereby turning it off. This causes the NMOS device 406 to be completely turned off. As a result, the programming current Iprog is cut off from the memory cells 403 and 405, thereby preventing the voltage at the drain of the memory cell 405 from dropping even lower. This helps to reduce the voltage difference between the source and drain of the memory cell 405. Thus, the punch-through across the memory cell 405 can be avoided.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A non-volatile memory device comprising:
   at least one current source coupled to a bit line, along which at least two memory cells sharing a common source line are connected, for generating a programming current on the bit line when one of the memory cells is selected for programming operation; and
   at least one voltage regulator coupled to the bit line between the current source and the memory cells for allowing the programming current to flow between the current source and the selected memory cell when a voltage level on the bit line is higher than a predetermined reference voltage, and blocking the programming current flowing between the current source and the selected memory cell when the voltage level on the bit line is lower than the predetermined reference voltage, thereby preventing a punch-through across the unselected memory cell from occurring,
   wherein the voltage regulator further comprises:
   at least one first MOS device coupled to the bit line between the current source and memory cells;
   at least one comparator having a first input terminal coupled to the predetermined reference voltage and a second input terminal coupled to the bit line between the first MOS device and the memory cells, for outputting a control signal indicating if the voltage on the bit line between the first MOS device and the memory cells is lower than the predetermined reference voltage; and
   at least one latch module coupled between the control signal of the comparator and a gate of the first MOS device for generating a latched control signal to turn off the first MOS device in response to the control signal.

2. The non-volatile memory device of claim 1 wherein the latch module further comprises at least two cross-coupled NAND logic gate devices.

3. The non-volatile memory device of claim 2 further comprising a charge pump coupled to the common source line for raising a voltage level thereon when the selected memory cell is being programmed.

4. The non-volatile memory device of claim 3 further comprising an inverter coupled to the latched module for inverting the latched control signal.

5. The non-volatile memory device of claim 4 further comprising a second MOS device having a drain coupled to the bit line between the current source and the first MOS device, a source coupled to an output terminal of the charge pump, and a gate controlled by the inverted latched control signal, wherein the second MOS device allows the programming current to flow between the current source and the output terminal of the charge pump when the first MOS device is turned off.

6. A non-volatile memory device comprising:
   at least one current source coupled to a bit line, along which at least two memory cells sharing a common source line are connected, for generating a programming current on the bit line when one of the memory cells is selected for programming operation;
   a charge pump coupled to the common source line for raising a voltage level thereon when the selected memory cell is being programmed; and
   at least one voltage regulator coupled to the bit line between the current source and the memory cells for allowing the programming current to flow between the current source and the selected memory cell when a voltage level on the bit line is higher than a predetermined reference voltage, and blocking the programming current flowing between the current source and the selected memory cell when the voltage level on the bit line is lower than the predetermined reference voltage, thereby preventing a punch-through across the unselected memory cell from occurring, wherein the voltage regulator comprises;

at least one first NMOS device coupled to the bit line between the current source and memory cells for selectively allowing the programming current to pass thereacross;

at least a first inverter having an output terminal coupled to a gate of the first NMOS device; and a first PMOS device and a second NMOS device serially coupled between a power supply and ground, the first PMOS device and the second NMOS device having their drains coupled together to an input terminal of the first inverter, and the second NMOS device having its gate coupled to the bit line between the memory cells and the first NMOS device.

7. The non-volatile memory device of claim 6 wherein the voltage regulator comprises a second PMOS device and a third NMOS device serially coupled between the power supply and the ground, the second PMOS device and the third NMOS device having their drains coupled together to a gate of the second PMOS device and the gate of the first PMOS device, wherein the third NMOS device is turned on by the predetermined reference voltage coupled to its gate, such that when the second NMOS device is turned off by the voltage level on the bit line, the first inverter outputs a low signal to turn off the first NMOS device, thereby blocking the programming current flowing between the current source and the memory cells.

8. The non-volatile memory device of claim 7 further comprising a second inverter coupled to an output terminal of the first inverter for inverting an output signal of the first inverter.

9. The non-volatile memory device of claim 8 further comprising a fourth NMOS device having a drain coupled to the bit line between the current source and the first NMOS device, a source coupled to an output terminal of the charge pump, and a gate controlled by an output signal of the first inverter, wherein the fourth NMOS device allows the programming current to flow between the current source and the output terminal of the charge pump when the first NMOS device is turned off.

10. A non-volatile memory device comprising:

at least one MOS device coupled to a bit line, along which at least two memory cells sharing a common source line are connected, for regulating a programming current on the bit line in response to a programming bias signal when one of the memory cells is selected for programming operation;

a charge pump coupled to the common source line for raising a voltage level thereon when the selected memory cell is being programmed; and at least one voltage regulator coupled to the bit line between the MOS device and the memory cells for allowing the programming current to flow between the MOS device and the selected memory cell when a voltage level on the bit line is higher than a predetermined reference voltage, and blocking the programming current flowing between the MOS device and the selected memory cell when the voltage level on the bit line is lower than the predetermined reference voltage, thereby preventing a punch-through across the unselected memory cell from occurring, wherein the voltage regulator comprises a first NMOS device having a gate coupled to a gate of the MOS device, and a source coupled to ground.

11. The non-volatile memory device of claim 10 wherein the voltage regulator comprises a first PMOS device having a drain coupled to the gate and drain of the first NMOS device, and the first PMOS device being controlled by the predetermined reference voltage.

12. The non-volatile memory device of claim 11 wherein the voltage regulator comprises a second PMOS device coupled between a power supply and a source of the first PMOS device, and being controlled by the programming bias signal for regulating a voltage level applied to a gate of the MOS device from the power supply via the first and second PMOS devices.

13. The non-volatile memory device of claim 12 wherein the voltage regulator further comprises a third PMOS device having a source coupled to a drain of the second PMOS device, a gate coupled to the bit line between the memory cells and the MOS device, and a drain coupled to an output terminal of the charge pump.

* * * * *